United States Patent
Ramsbey et al.

(10) Patent No.: US 6,251,717 B1
(45) Date of Patent: *Jun. 26, 2001

(54) VIABLE MEMORY CELL FORMED USING RAPID THERMAL ANNEALING

(75) Inventors: Mark Ramsbey, Sunnyvale; Daniel Sobek, Portola Valley; Nicholas H. Trispas, San Jose, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,315

(22) Filed: Sep. 30, 1998

(51) Int. Cl.$^7$ .................................. H01L 21/8242
(52) U.S. Cl. ........................ 438/190; 438/193; 438/195
(58) Field of Search .................. 438/190, 191, 438/192, 262, 263, 264, 265, 193, 194, 195; 257/341, 342, 343, 41, 42, 40, 751, 753

(56) References Cited

U.S. PATENT DOCUMENTS

| | | | |
|---|---|---|---|
| 5,304,831 | * 4/1994 | Yilmaz et al. | 257/341 |
| 5,324,686 | * 6/1994 | Tsunashima | 437/152 |
| 5,429,964 | * 7/1995 | Yilmaz et al. | 437/41 |
| 5,585,308 | * 12/1996 | Sardella | 437/190 |
| 5,656,513 | 8/1997 | Wang et al. | |
| 5,700,717 | * 12/1997 | Nowak et al. | 437/192 |
| 5,903,054 | * 5/1999 | Sardella | 257/751 |
| 5,936,889 | * 8/1999 | Choi | 365/185 |

* cited by examiner

*Primary Examiner*—Chandra Chaudhari
*Assistant Examiner*—Laura Schillinger

(57) ABSTRACT

A method for forming viable floating gate memory cells in a semiconductor substrate. At various points within the memory cell manufacturing process rapid thermal annealing is used to repair any damage that may be caused to the crystals in the substrate by various processing steps. By quickly repairing any damage to the crystals of the substrate, the rate and amount of overall transient enhanced diffusion of the various dopants within the substrate can be greatly reduced, thereby allowing the production of a viable memory cell. Specifically, the present invention uses rapid thermal annealing during and following the formation of the source and drain regions and the interconnection regions effecting electrical connection between the source regions. This desensitizes the erase rates of the semiconductor device to the etching conditions employed to form the connections.

20 Claims, 8 Drawing Sheets

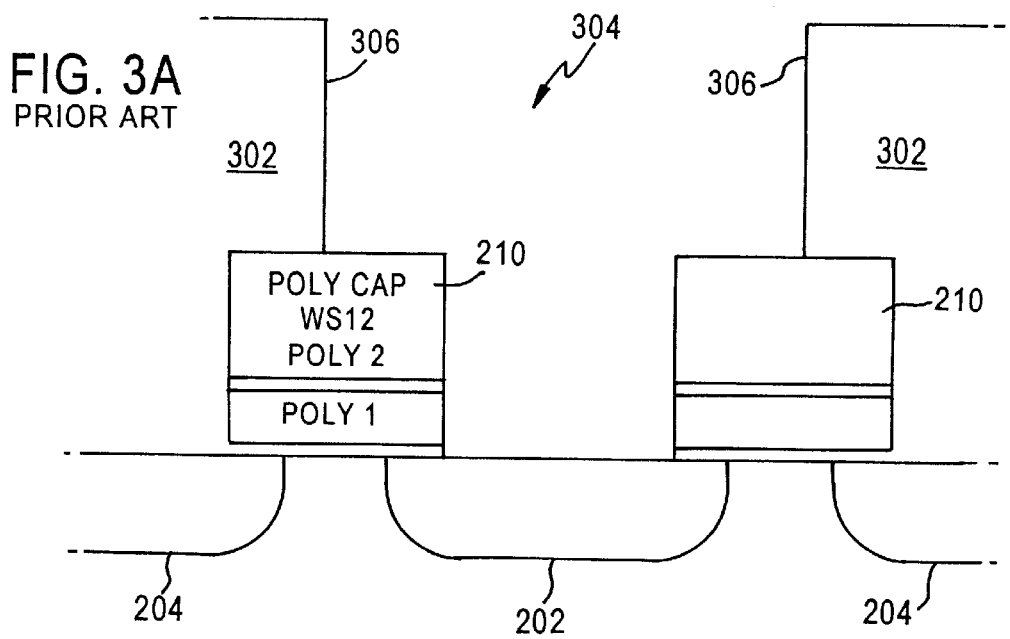
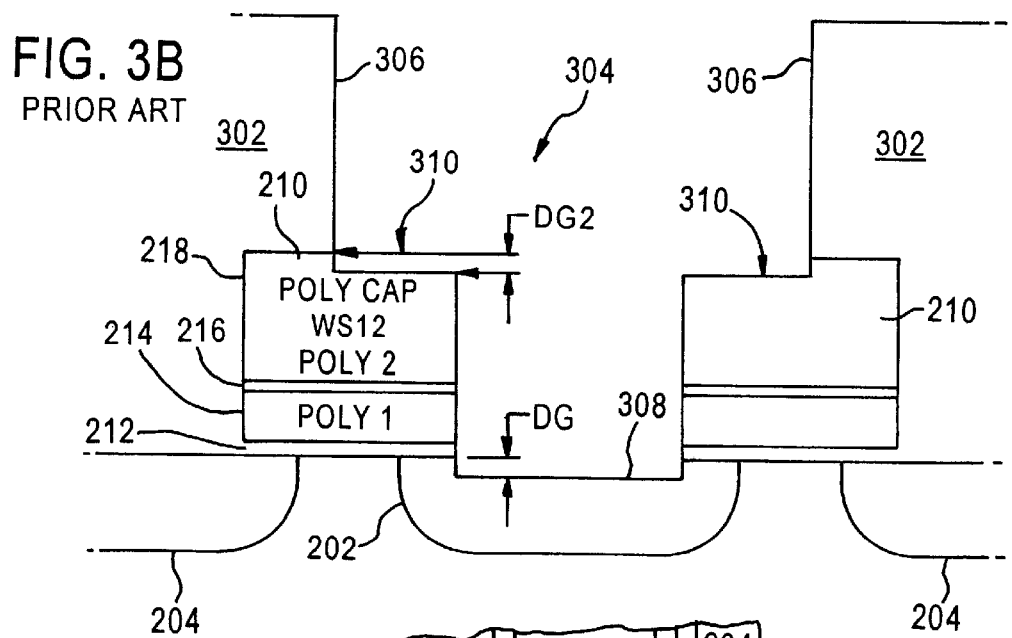
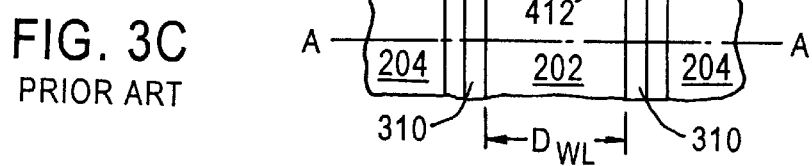

VIABLE MEMORY CELL FORMED USING RAPID THERMAL ANNEALING

FIELD OF THE INVENTION

The present invention relates to high density semiconductor devices and to a method for forming and connecting active regions and components of a high density semiconductor device, and in particular, connecting the source regions of the cells in a memory array.

BACKGROUND OF THE INVENTION

In general, memory devices such as a flash electrically erasable programmable read only memory (EEPROM) are known. For example, referring to FIGS. 1, 2A, and 2B, a flash EEPROM 100, commonly comprises a single substrate 102 in which one or more high density core regions 104 and low density peripheral portion 106 are formed. Typical high-density cores 104 comprise at least one M×N array 104 of individually addressable, substantially identical memory cells 200 (FIGS. 2A and 2B). Low-density peripheral portions 106 normally include input/output (I/O) circuitry and circuitry for selectively addressing the individual cells. The selective addressing circuitry typically includes one or more x-decoders and y-decoders, cooperating with the I/O circuitry for connecting the source, the gate, and the drain of selected addressed cells to predetermined voltages or impedance to effect designated operations on the cell, e.g., programming, reading, and erasing, and deriving necessary voltages to effect such operations.

Referring now to FIGS. 2A and 2B, each cell 200 in core 104 includes a source 202, a drain 204, and channel 206 semiconductor regions formed in substrate 102 (or in an isolation well), and a stacked gate (word line) structure 210. Gate structure 210 suitably includes a thin gate dielectric layer 212 (commonly referred to as the "tunnel oxide") formed on the surface of substrate 102 overlying channel 206, a floating gate 214 overlying tunnel oxide 212, an interpoly dielectric 216 overlying floating gate 214, and a control gate 218 overlying interpoly dielectric layer 216. Cells 200 are arranged in a series of rows and columns.

In the completed array, the control gates 218 of the respective cells 200 in a row are formed integral to a common word line (WL) associated with the row. Columns of cells are arranged such that adjacent cells in a column share a common semiconductor region as source or drain regions. The source 202 of each cell in a column (excepting end cells) is formed in a common region with one of the adjacent cells, e.g., the preceding cell in the column. Likewise, the drain of one cell is formed in a common region with the drain 204 of the other adjacent cell, e.g., next succeeding cell in the column. The drain of each cell in a column of cells is connected by a conductive bit line (BL) (FIG. 2B) including an overlying layer of metal connected to each drain 204 of the cells 200 within the column. Additionally, the sources of each cell 200 in a row (and hence pairs of rows) are interconnected by a common source line CS (FIGS. 2A, 2B) formed in substrate 102, as will be described. Any particular cell 200 within array 104 can be individually addressed (programmed and read) by operating upon one word line and one bit line.

Typically, in forming an EEPROM 100, a pattern of field oxide regions 220 is initially formed to provide electrical isolation between the respective devices of memory device 100. For example, field oxide regions 220 are used to provide isolation between core array 104 and the devices of peripheral region 106, as well as between the various columns of cells 200 within core array 104. Field oxide regions are conventionally formed using a mask and selective growth process. A layer of thermal oxide ("barrier oxide" or "pad oxide") is grown or deposited over the surface of substrate 102. A mask, frequently composed of nitride, is deposited on the barrier oxide, and patterned to cover those regions of substrate 102 in which devices are to be formed (herein referred to as active regions). Field oxide is then grown in the exposed areas of the barrier oxide by, for example, local oxidation of silicon (LOCOS), and the masking layer and barrier oxide are stripped to expose the underlying substrate 102. In general, referring to FIG. 2A, within the core 104, the selective growth process results in alternating parallel strips of field oxide 220 and exposed regions corresponding to the columns of cells 200 in the array.

Stacked gate word line structures 210 are then typically formed. For example, tunnel dielectric 212, suitably including a thin (e.g., approximately 100 angstroms) layer of oxide, is initially formed on substrate 102 by a suitable technique, such as, for example, thermally oxidizing the surface of substrate 102 or by depositing a suitable material on substrate 102. A layer of suitable conductive polysilicon (e.g., polycrystalline silicon), that will ultimately form floating gates 214, is then formed on tunnel dielectric 212. For example, conductive polysilicon may be deposited by any suitable technique, e.g., conventional chemical vapor deposition (CVD). The polysilicon layer is typically then masked and etched to remove strips overlying field oxide regions 220, leaving isolated strips of polysilicon on top of tunnel dielectric 212 overlying the substrate regions corresponding to the columns of cells 200 of array 104 (i.e. the regions in which source, channel, and drain regions of cells in the column will be formed). A layer of suitable dielectric material, such as, e.g., an oxide-nitride-oxide (ONO) layer, that will ultimately form interpoly dielectric 216 is typically then formed by a suitable technique. For example, where interpoly dielectric 216 is ONO, it is suitably formed by growing a layer of oxide, depositing a layer of nitride, followed by growing a layer of oxide, depositing a layer of nitride, followed by growing another layer of oxide. Interpoly dielectric layer 216, in the completed array, insulates control gates 218 from floating gates 214 in the individual cells and electrically isolates the adjacent columns of floating gates 214 in array 104. Another layer of suitable conductive polysilicon (e.g., polycrystalline silicon), that will ultimately form control gates 218 (and word lines WL connecting the control gates of the cells in the respective rows of array 104) is then deposited on the interpoly dielectric layer, by a suitable technique, such as, for example, by conventional chemical vapor deposition (CVD). If desired, a silicide layer (not shown) may be provided over polysilicon layer 218 to reduce resistance. Portions of the respective polysilicon and interpoly dielectric layers are then selectively removed to define stacked gate structures 210 on tunnel dielectric layer 212, i.e., to form the floating gates 214, interpoly dielectric layer 216 and control gates 218 of the individual cells, and word lines WL (portions of interpoly dielectric 216 and control gate polysilicon layers, bridging field oxide regions 220, to connect the respective cells of the rows of the array). This is typically effected by suitable masking and etching techniques. When completed, the etch creates respective generally parallel word-line structures 210 separated by a distance $D_{WL}$, as depicted in FIG. 2A.

Conventionally, the portions of field oxide 220 and tunnel dielectric 212 between every second pair of adjacent word lines 210 in array 104 (i.e., the regions, generally indicated as 222, where source regions 202 are to be formed and the portions of field oxide 220 disposed between source regions 202 of the corresponding cells of adjacent columns) are then removed, in preparation for formation of the common line (CS, FIG. 2A) connecting the sources. This is typically effected using a conventional self-aligned source etch (SAS). As will be discussed, the selective etch, however, normally removes not only the exposed field oxide regions 220, but also the exposed tunnel oxide 212, a portion of the exposed polysilicon, and a portion of the underlying substrate 102.

In a conventional process, source 202, common line CS, and drain 204 regions are then formed. Source 202 and common source line CS are formed by initially effecting a conventional double diffusion implant (DDI), with the SAS mask still in place. The DDI implants a first dopant (e.g., n-type), suitably phosphorous, to form a deeply diffused but lightly doped N well 202A (FIG. 2A), establishing a graded source-channel junction. The SAS mask is then removed. The DDI implant is typically driven deeper into substrate 102, by subjecting substrate 102 to a thermal cycle at high temperature (e.g., 1050 degrees Celsius). A shallow second implant, commonly referred to as a medium diffused drain (MDD) implant, is then performed (e.g., with arsenic) to create a more heavily doped, but shallower, n+ well 202B embedded within deep N well 202A. The MDD implant also forms a shallow, abrupt drain 204.

Conventionally, periphery transistors, passivation layers, and conductive interconnect layers (formed of, for example, polysilicon or metal) are then formed. The entire device is oxidized to form a sealing layer of silicon dioxide (not depicted) and finished and packaged for distribution.

Current is selectively conducted between source 202 and drain 204 in accordance with the electric field developed in channel 206 by gates 214, 218. By appropriately charging (programming) and discharging (erasing) floating gate 214, the threshold voltage $V_T$ of cell 200 (i.e., the voltage $V_G$ that must be applied to control gate 218 to cause current flow between source and drain above a predetermined level) may be selectively varied to program cell 200.

An individual cell 200 is programmed by charging floating gate 214 through high energy electron injection, often referred to as hot electron injection. By applying the appropriate potentials to source 202, drain 204, and control gate 218, hot electrons are injected from channel 206 through tunnel dielectric 212 to negatively charge floating gate 214. Charging floating gate 214 with a negative potential raises the threshold voltage of the cell by a predetermined mount V from a first nominal value $V_{T1}$ to a second nominal value $V_{T2}$. As a result, a programmed cell 200 ($V_T > V_{T2}$) conducts substantially less current during a subsequent read operation than an unprogrammed cell 200 ($V_T < V_{T1}$) having no charge on floating gate 214.

During a read operation, a predetermined voltage $V_G$ is applied to control gate 218 of selected cell 200. If the selected cell 200 is unprogrammed ($V_T < V_{T1}$), the gate voltage $V_G$ exceeds the threshold voltage $V_{T1}$ of the cell, and cell 200 conducts a relatively high current (above a predetermined upper threshold level, e.g., 100 microamps). Conduction of such high level current is indicative of the first state, e.g., a zero or logical low. On the other hand, if the selected cell 200 has been programmed ($V_T > V_{T2}$), gate voltage $V_G$ is less than the threshold voltage $V_{12}$ of the cell, and the cell is non-conductive, or at least conducts less current (below a predetermined lower threshold level, e.g. 20 microamps). Conduction of such low level current is indicative of a second state, e.g., one or logical high.

In contrast to the programming procedure, flash EEPROM's are typically bulk-erased, so that all of the cells 200 in array 104 (i.e., connected to a common source line CS) are simultaneously erased. Appropriate potentials applied to the source 202, drain 204 and control gate 218, cause electron tunneling from floating gate 214 to source 202 (or drain 204) via Fowler-Nordheim (F-N) tunneling. For example, electrons stored during programming on floating gate 214 tunnel through dielectric 212 in the area (referred to as a tunnel region 203) where floating gate 214 overlaps source region 202. F-N tunneling occurs simultaneously for all cells 200 within memory array 104, erasing entire array 104 in one "flash" or operation.

Because each cell 200 is connected to common source line CS, all cells 200 in array 104 are erased for the same amount of time. Ideally, each cell 200 in array 104 requires the same amount of time to erase, i.e. to remove electrons from floating gate 214 and achieve a lower selected threshold voltage. Erase times among cells 200 within array 104, however, differ widely. Because of the variation in erase times, each cell 200 must be erased for the amount of time required to erase the slowest cell in array 104. Erasing faster cells 200 for too long, however, results in over-erasure. Over-erasure generates a positive charge on floating gate 214, which excessively lowers the threshold voltage $V_T$ of cell 200, in some instances to the extent of establishing a negative threshold voltage ($V_T < 0$). As a result, the over-erased cell 200 may be continuously activated, even when control gate 218 is grounded ($V_G = 0$ volts), so that cell 200 always conducts during a read operation, regardless of whether over-erased cell 200 is the cell selected for reading. In addition, the increase V in threshold voltage effected by programing, may not be sufficient to raise the threshold voltage $V_T$ of the over-erased cell above the predetermined voltage $V_G$ applied to control gate 218 of selected cell 200, so that even when programmed, the over-erased cell conducts upon application of $V_G$ during the read process, giving an erroneous reading.

The current conducted by over-erased cells 200 in a column during a read operation is known as "column leakage current". Column leakage current manifests itself by degrading or destroying the memory's reliability and endurance. As discussed above, the bit value of a selected cell 200 depends on the magnitude of the drain current provided at the associated bit line BL. Drain 204 of each cell 200 in a column, however, is connected to the associated bit line BL. Ideally, the only cell in the column biased for possible conduction is the cell in the selected word line WL; the predetermined voltage $V_G$ is applied to the gates of cells on the selected word line and all other gates are grounded during the reading process. If selected cell 200 is unprogrammed, current in excess of the upper threshold value will be provided on the bit line, indicating e.g., a zero. If the selected cell is programmed, with a "1", the drain current of the cell (and, ideally, the bit line), is below the lower threshold value during the read operation. However, the current in the bit line reflects the cumulative current flow from all of the cells in a column. Accordingly, if any of the cells in the column are over-erased and conduct significant current during the read operation, the current flow in the bit line may be in excess of the upper threshold value. Consequently, the read operation generates a logical zero regardless of which cell in the column is selected or whether the selected cell is programmed. In a severe case, a single over-erased cell will disable the entire column. In another case, many of the cells may be slightly over-erased which provides a cumulative column leakage current in excess of the upper threshold value. For example, if each cell in a column of 512 cells leaks 0.2 microamps, the total column leakage current is 102.4 microamps, in excess of the upper threshold value of 100 microamps, thereby disabling the entire column. Milder cases may simply degrade the performance of the memory over time, greatly reducing the reliability and endurance of the device, i.e., the number of cycles the device can be successfully programmed and erased.

It has been found that the disparity of erase times in conventional EEPROM cells 200 within array 104 is caused, at least in part, by structural and doping variations among cells 200. For example, the erase time cell 200 is affected by the F-N tunneling rate through tunnel dielectric 212, which, in turn, varies inversely with the square of the distance between floating gate 214 and source 202 in tunneling region 203 and varies directly with the doping concentration of tunneling region 203 near source 202, and specifically at the surface of channel 206. The geometry of each cell 200 near tunneling region 203, however, is difficult to control without significantly increasing the size of each cell. For example, as noted above, in forming memory devices a Self-Aligned Source (SAS) etch is typically used to remove the portions of field oxide 220 disposed between source regions 202 of the corresponding cells of adjacent rows (hereinafter referred to as the "inter-source" field oxide regions). Such an etch often causes variations in the geometries of the individual cells. Referring to FIGS. 3A–3C and 4A–4B, a masking layer of photo resist 302 is deposited over array 104, then patterned to mask (cover) drain regions 204 and the field oxide regions 220 isolating the drains of cells in adjacent columns, with open strips 304 exposing the source regions 202 of the corresponding cells of adjacent rows and the inter-source portions of field oxide 220; openings 304 have edges 306 disposed along the centers of the word lines 210 of adjacent rows of cells. A highly selective etch is then performed to remove the exposed portions of field oxide 220.

While the etch is highly selective in that it etches the field oxide at a much higher rate than the polysilicon word line or silicon, it is not totally selective; portions of the silicon of source region 202, as well as portions of the exposed polysilicon, are etched away. Referring to FIGS. 3A and 3B, the portions of tunnel dielectric 212 overlying the portions of substrate 102 where source regions 202 are to be formed are exposed by openings 304, as well as the inter-source portions of field oxide 220. The etch operates upon tunnel oxide 212 at the same rate as field oxide 220. Field oxide 220 is typically considerably thicker (e.g., 4000–5000 Angstroms) than tunnel oxide 212 (e.g., 100–200 Angstroms). By the time the inter-source portions of field oxide 220 are removed, not only has the etch removed the gate oxide 212 overlying the source region, but, as seen in FIG. 3A, it has also removed a portion of the silicon substrate 102 in the source region, producing a gouge of depth $D_G$ typically on the order of 200 Angstroms, in upper surface 308 of source region source 202. The depth $D_G$ of the gouge in source region 202 and the profile of surface 308 significantly affect the diffusion of dopants into tunneling region 203. In particular, the gouge increases the distance through which the dopants must travel to extend to the surface of channel 206, as depicted in FIG. 2A. Consequently, the gouge in surface 308 tends to decrease doping concentration in source 202 in tunneling region 203 when compared to an ungouged surface. Significantly, the gouging varies from cell to cell, creating non-uniformity.

Further, as seen in FIGS. 3A and 3B, a portion 310 of the exposed area of word line 210 is also etched away. This leads to the creation of a longitudinal step of depth $D_{G2}$ typically on the order of 400 Angstroms, on the source side of the control gates 218 of the respective cells. This tends to increase the resistance of the word line 210.

Moreover, referring to FIGS. 3C and 4B, the etching process typically does not produce a vertical edge where field oxide 220 is removed. Rather, the process tends to produce sloping edges 412, extending outwardly from the edge of word line 210. Sloping edges 412 tend to constrict the portion 414 of substrate 102 exposed for implantation in the vicinity of field oxide 220. Thus, the width of common source line CS connection adjacent source regions 202, tends to be less than the distance $D_{WL}$ between respective adjacent word lines (the length of the source regions), and the resistance of the common source line CS is increased as compared to a wider region. In conventional memory arrays, such resistance is in the range of from 150 to 1000 ohms per bit. For example, the common source line CS of a memory array created using an SAS etching process may present a 3 square resistance structure (length in direction of current flow to width ratio), equating to approximately 180 ohms per bit.

For miniaturization, it is desirable to dispose adjacent word lines as closely together as possible, i.e., minimize distance $D_{WL}$. The constriction of source line CS connecting adjacent source regions 202 by sloping edges 412 (and concomitant increased resistance), tends to be a limiting factor in miniaturization.

As an alternative to conventional self-aligned source technology, U.S. Pat. No. 5,656,513 (hereinafter the '513 patent), describes a mechanism to avoid the problems introduced by a self-aligned source etch process without sacrificing the advantages of self-aligned source technology. Rather than performing a self-aligned source etch to remove the field oxide to facilitate forming the connection between adjacent source regions, a field oxide layer is left intact, and a high energy implantation process is employed in conjunction with a self-aligned source mask to form the inter-source connection. The method described in the '513 patent uses a sufficiently high dose of dopants implanted at a sufficiently high energy level to cause the dopant to pass through the inter-source field oxide regions and locate within a predetermined region in substrate 102 to form low resistivity source interconnection regions underlying field oxide regions 220, thereby electrically connecting adjacent source regions.

Both conventional self-aligned source etching and the methodology described in the '513 patent have the disadvantage of allowing transient enhanced diffusion to occur to the DDI profile as a result of the low voltage source implantation step and the self-aligned source etching step. The implantation of dopants and self-aligned source etching can cause molecular damage to the silicon substrate that can enhance diffusion of the dopant. Current size restraints require the semiconductor device be manufactured using shallow pn junctions. The use of shallow junctions allows the damage caused by the implantation and the etching to remain near the junction, which results in high junction leakage currents. The transient enhanced diffusion of the dopants significantly effects the performance of the semiconductor device, and particularly with EEPROM memory devices, the diffusion can affect the erase rates of memory devices. Consequently, a need exists for a method for forming and connecting active regions and components of a high density semiconductor device wherein the erase rates of the device are not sensitive to the etching conditions used to form the connections.

SUMMARY OF THE INVENTION

The present invention provides a mechanism avoiding the problems introduced by a self-aligned source etch process without sacrificing the advantages of self-aligned source technology. There is a need for a method for forming and connecting active regions and components of a high density semiconductor device wherein the erase rates of the device are not sensitive to the etching conditions used to form the connections.

The present invention advantageously provides a method for forming viable floating gate memory cells in a semiconductor substrate. At various points within the memory cell manufacturing process rapid thermal annealing is used to repair any damage that may be caused to the crystals in the substrate by various processing steps. By quickly repairing any damage to the crystals of the substrate, the rate and amount of overall transient enhanced diffusion of the various dopants within the substrate can be greatly reduced, thereby allowing the production of a viable memory cell. Specifically, the present invention uses rapid thermal annealing during and following the formation of the source and drain regions and the interconnection regions effecting electrical connection between the source regions.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

BRIEF DESCRIPTION OF THE DRAWINGS

FIG. 3A is a partial, sectional view of an intermediate state (partially complete) of a portion of a cell array taken along section line A—A in FIG. 3C, depicting respective adjacent word lines and a self-aligned source masking layer prior to a selective etching.

FIG. 3B is a partial, sectional view of an intermediate state (partially complete) of a portion of a cell array taken along section line A—A in FIG. 3C, depicting respective adjacent word lines and a self-aligned source masking layer after a selective etching.

FIG. 3C is a partial, top view of an intermediate state (partially complete) of a portion of a cell array, depicting respective adjacent word lines, field oxide, and source and drain regions, after a conventional self-aligned source etching process.

DETAILED DESCRIPTION OF THE INVENTION

Figure 2B:
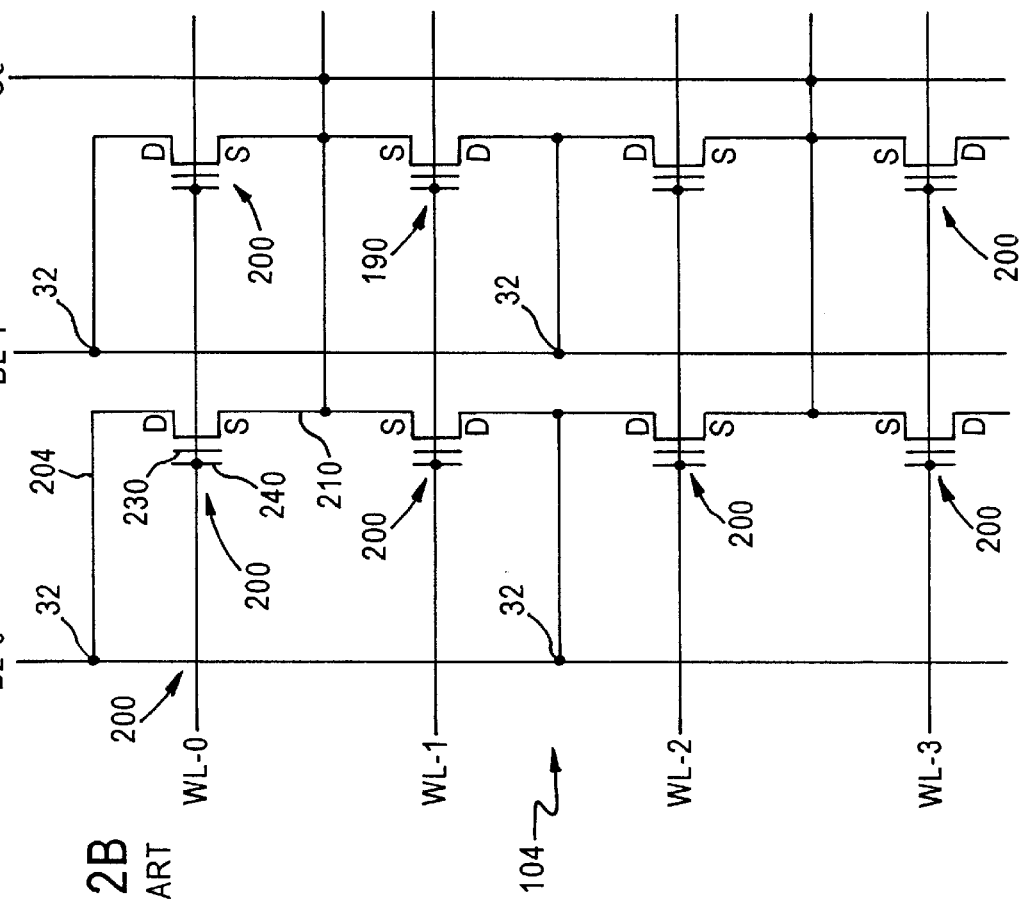
FIG. 2B is a schematic diagram of a portion of the cell array of FIG. 2A.
Figure 1:
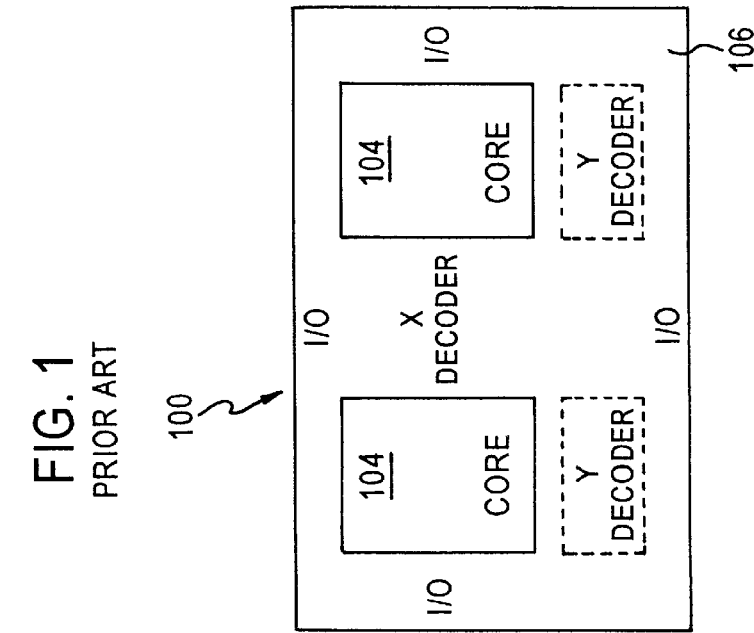
FIG. 1 is a top view of a conventional memory device having an area of high-density circuitry and an area of lower density circuitry.
Figure 2A:
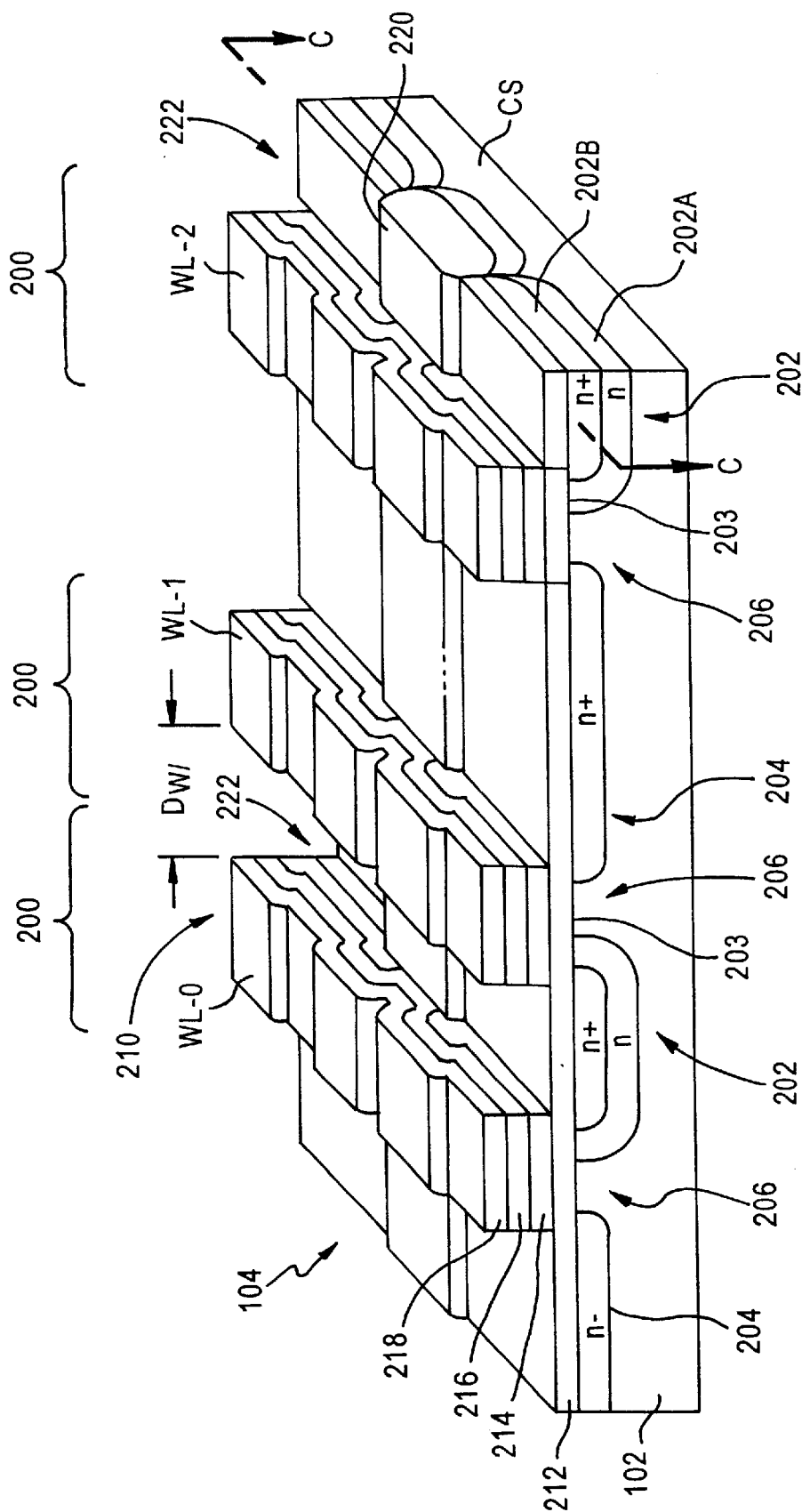
FIG. 2A is a partial, sectional perspective view of a portion of an intermediate state (partially complete) of a cell array core.
Figure 4A:
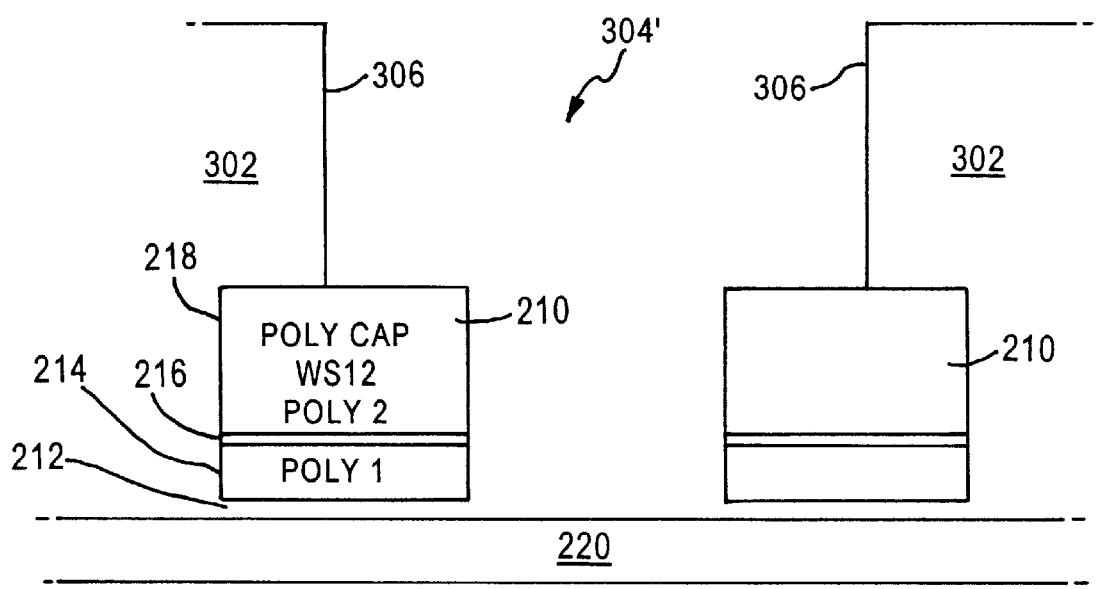
FIG. 4A is a partial, sectional view of an intermediate state partially complete) of a portion of a cell array taken along section line B—B in FIG. 3C, depicting respective adjacent word lines and a conventional self-aligned source masking layer prior to a selective etching.
Figure 4B:
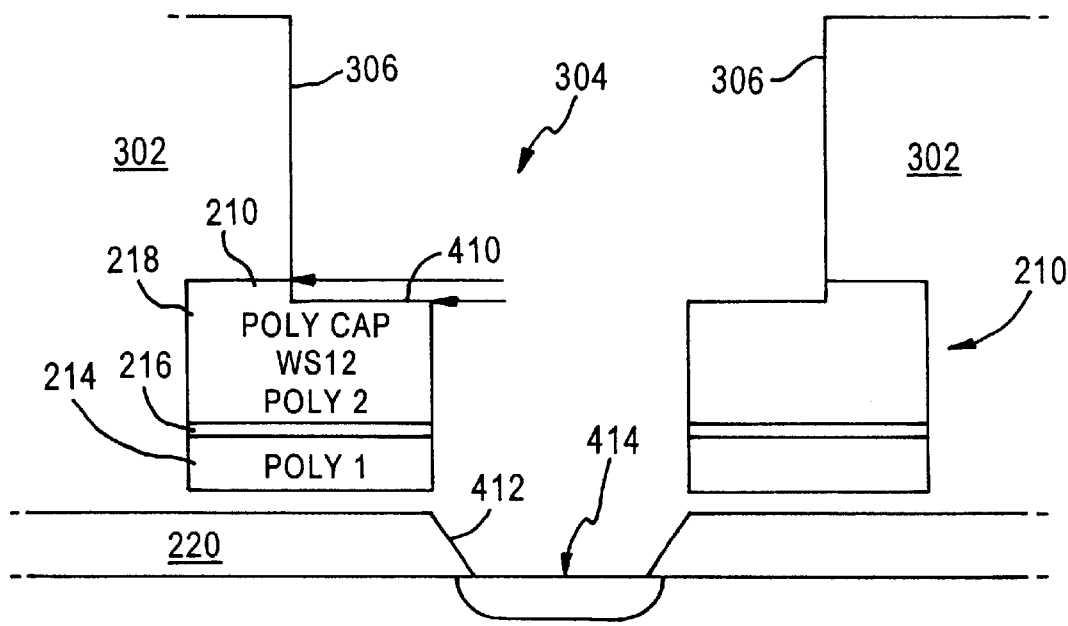
FIG. 4B is a partial, sectional view of an intermediate state (partially complete) of a portion of a cell array taken along section line B—B in FIG. 3C, depicting respective adjacent word lines and a conventional self-aligned source masking layer after a selective etching.

Referring again to FIG. 2B, as previously noted, in forming an array 104 of memory cells 200, a pattern of field oxide regions 220 is initially formed on a suitable substrate 102 (e.g., silicon doped with p-type dopants, such as boron). Field oxide regions 220 are patterned to form strips interposed between the areas where columns of cells will be formed. A series of parallel stacked gate word line structures 210 (one corresponding to each row) are then formed, perpendicular to and extending over the field oxide strips 220, spaced apart by distance $D_{WL}$. The crisscrossing pattern of field oxide strips 220 and stacked gate word line structures may be formed by any suitable methodology. In conventional formation processes, as previously noted, a self-aligned source etch is performed to remove the inter-source portions of field oxide 220, followed by further doping in exposed regions of substrate 102 (in predetermined disposition to stacked gate structures 210) to form the source and drain regions of cells 200.

Figure 5A:
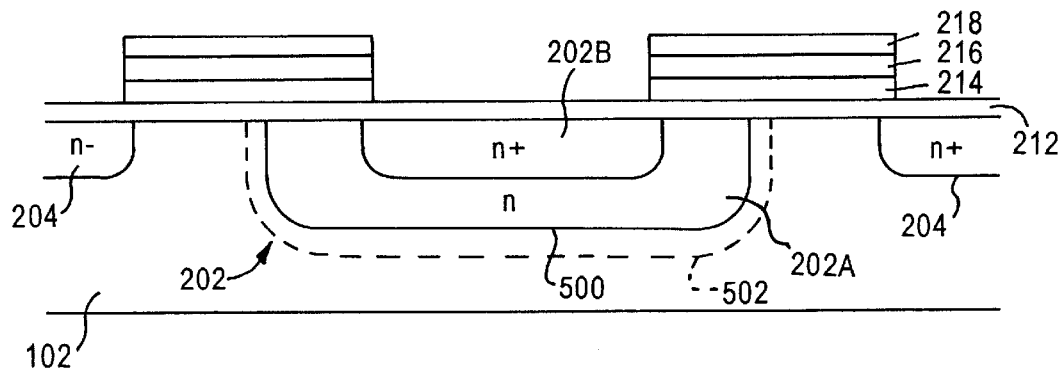
FIG. 5A is a partial, sectional view of a portion of an intermediate state (partially complete) of a cell array core with a solid line 500 representing the outer boundary of a deep N well 202A and a dashed line 502 representing the outer boundary of the deep N well 202A after an implantation step using a conventional method.
Figure 5B:
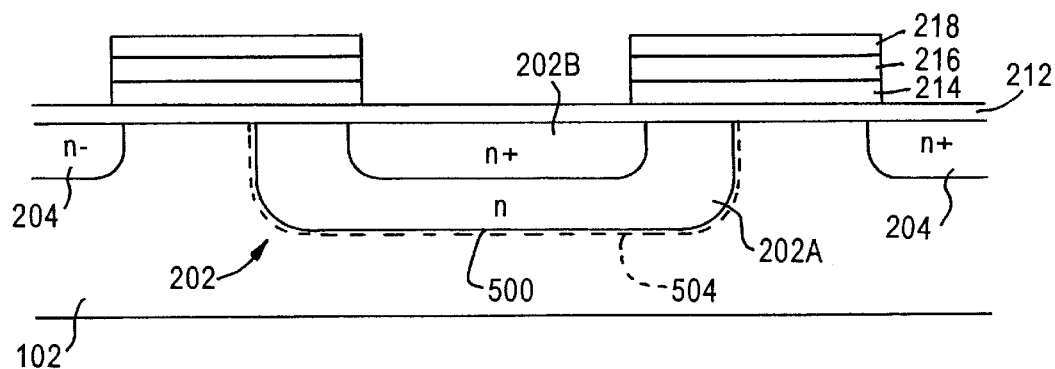
FIG. 5B is a partial, sectional view of a portion of an intermediate state (partially complete) of a cell array core with a solid line 500 representing the outer boundary of a deep N well 202A and a dashed line 504 representing the outer boundary of the deep N well 202A after an implantation step using a method according to the present invention.

In the present invention the conventional self-aligned source etch and doping of the exposed regions of the substrate 102 is modified in order to prevent transient enhanced diffusion of dopant within the substrate 102 to produce a viable memory cell. FIG. 5A depicts the transient enhanced diffusion problem associated with the conventional method. In FIG. 5A, solid line 500 represents the outer boundary of a deep N well 202A prior to an implantation step and dashed line 502 represents the outer boundary of the deep N well 202A after the implantation step. Using conventional methodology, the dopant within the deep N well diffuses outwardly, thereby pushing the outer boundary 500 outward which results in high junction leakage currents. In FIG. 5B, solid line 500 represents the outer boundary of a deep N well 202A and dashed line 504 represents the outer boundary of the deep N well 202A after an implantation step using a method according to the present invention. FIG. 5B illustrates that by using a rapid thermal anneal after the etching and implantation steps, the amount of transient enhanced diffusion as depicted by dashed lines 502 and 504 can be reduced from an outward expansion in the range of several thousand angstroms to only a few hundred angstroms or less.

Figure 6A:
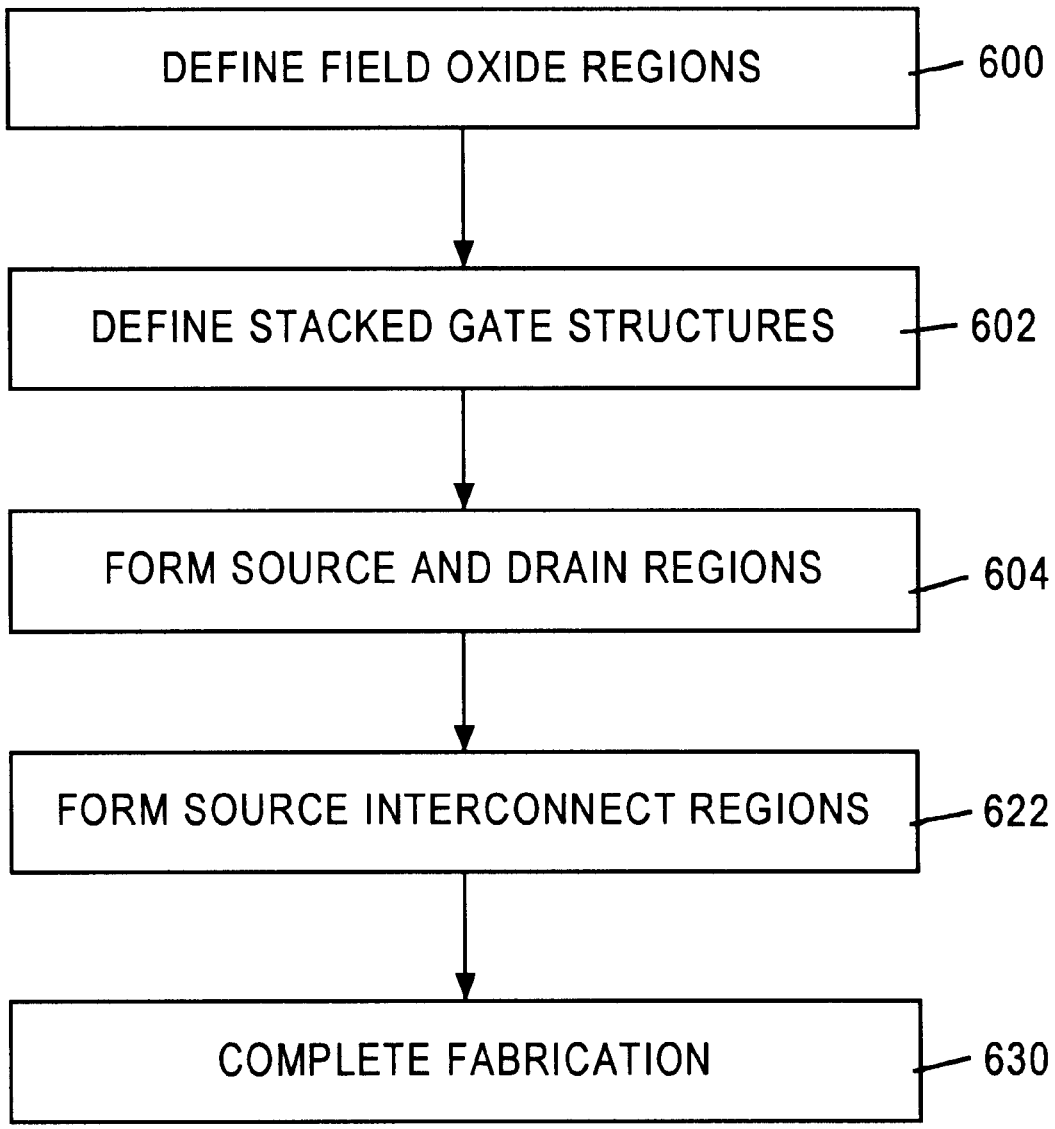
FIG. 6A is a flowchart of a general formation process.
Figure 6B:
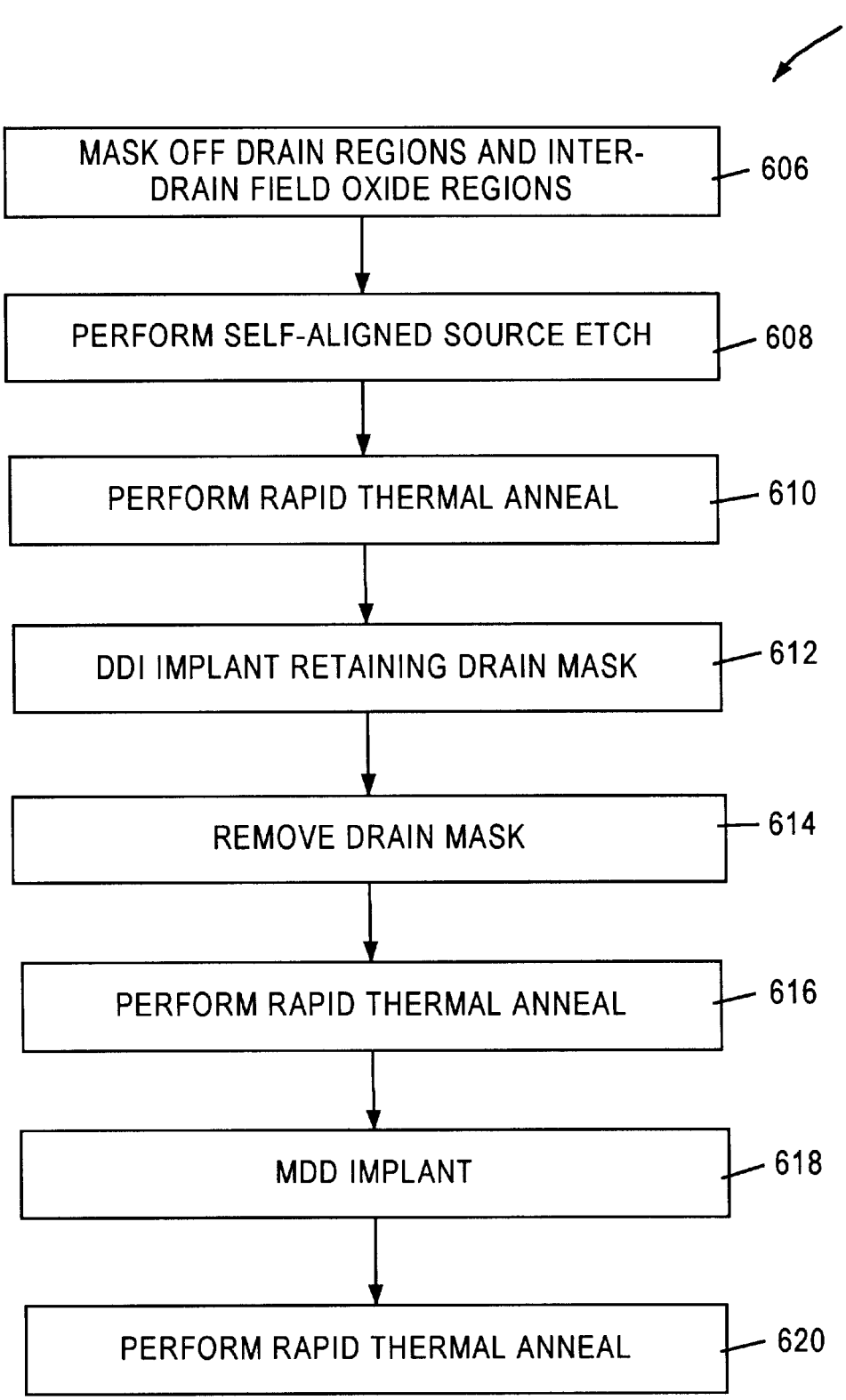
FIG. 6B is a flowchart setting forth a first embodiment of the present invention including a method of forming source and drain regions using rapid thermal annealing after etching and implantation steps.

A first exemplary embodiment of a method of the present invention for forming floating gate memory cells in a semiconductor substrate 102 is set forth in FIGS. 6A and 6B. The method includes a step 600 of forming areas of field oxide 220 to separate regions of substrate 102 corresponding to the cells 200, and then a step 602 of forming stacked gate structures 210 extending over the field oxide 220 areas, as was discussed above for the conventional methodology. Then the doped source regions 202 and drain regions 204 are selectively formed in the substrate regions corresponding to cells in alignment with the stacked gate structures 210 in step 604. Once the source regions 202 and drain regions 204 are formed the substrate 102 is subjected to another rapid thermal annealing step 620 (in FIG. 6B) to prevent transient enhanced diffusion of dopant within the substrate 102. The interconnection regions are then formed effecting electrical connection between the source regions 202. After the interconnection regions are formed, the substrate 102 may then be subjected to another rapid thermal annealing step (depicted for the second embodiment in FIG. 6C as step 628) to prevent transient enhanced diffusion of dopant within the substrate 102. The rapid thermal annealing steps repair the crystals in the substrate following the formation of the source and drain regions and the interconnection regions, thereby slowing the rate and amount of transient enhanced diffusion of the various dopants within the substrate 102. And finally, the fabrication is completed in step 630 using conventional methods.

FIG. 6B sets forth a detailed flowchart of one embodiment of the step 604 of forming the source and drain regions. The first step 606 includes forming a self-aligned source mask, thereby masking off the drain regions and inter-drain field oxide regions. Then a self-aligned source etch through the exposed field oxide regions is performed in step 608 followed by performing a double diffusion implant, as described above with reference to the conventional method. In the present invention the step of performing a self-aligned source etch is followed by a rapid thermal annealing of the substrate 102 in step 610 to prevent transient enhanced diffusion of dopant within the substrate 102. The double diffusion implant includes implanting a first dopant in step 612 with a self-aligned source mask in place, removing the self-aligned source mask in step 614, rapid thermal annealing of the substrate in step 616 to prevent transient enhanced diffusion of dopant within the substrate, and performing a shallow second implant with a second dopant in step 618 as described above. As stated above, the step 604 of forming source and drain regions is finished by performing a rapid thermal anneal of the substrate 102 in step 620.

The steps of rapid thermal annealing of the substrate in the present invention should be carried out as soon as possible after the respective etching or implantation steps in order to insure that transient enhanced diffusion is minimized. The rapid thermal annealing includes exposing the substrate 102 to a temperature in the range of 750° C. to 1200° C. Tests have shown that a preferred temperature range is from 900° C. to 1100° C., with the preferred temperature being about 950° C. The present invention contemplates a rapid thermal annealing step wherein the substrate is exposed to heat for a period of time in the range of ten seconds to two minutes, with a preferred time being about thirty seconds. The temperature and time ranges set forth above allow the crystals in the substrate sufficient opportunity to repair following the formation of the interconnection regions.

In contradistinction to conventional self-aligned source etch formation processes, the inter-source connections can be effected without performing a self-aligned source etch to remove the inner-source field oxide regions, as is contemplated by the second embodiment of the present invention. Instead, as set already known and described in U.S. Pat. No. 5,656,513, a sufficiently high dose of dopants may be implanted at a sufficiently high energy level to cause the dopant to pass through the inter-source field oxide regions and locate within a predetermined region in substrate 102 to form low resistivity source interconnection regions underlying field oxide regions 220, thereby electrically connecting adjacent source regions. In this manner, the nonuniformities and other disadvantages created by the etching process employed in conventional formation processes are avoided.

Figure 6C:
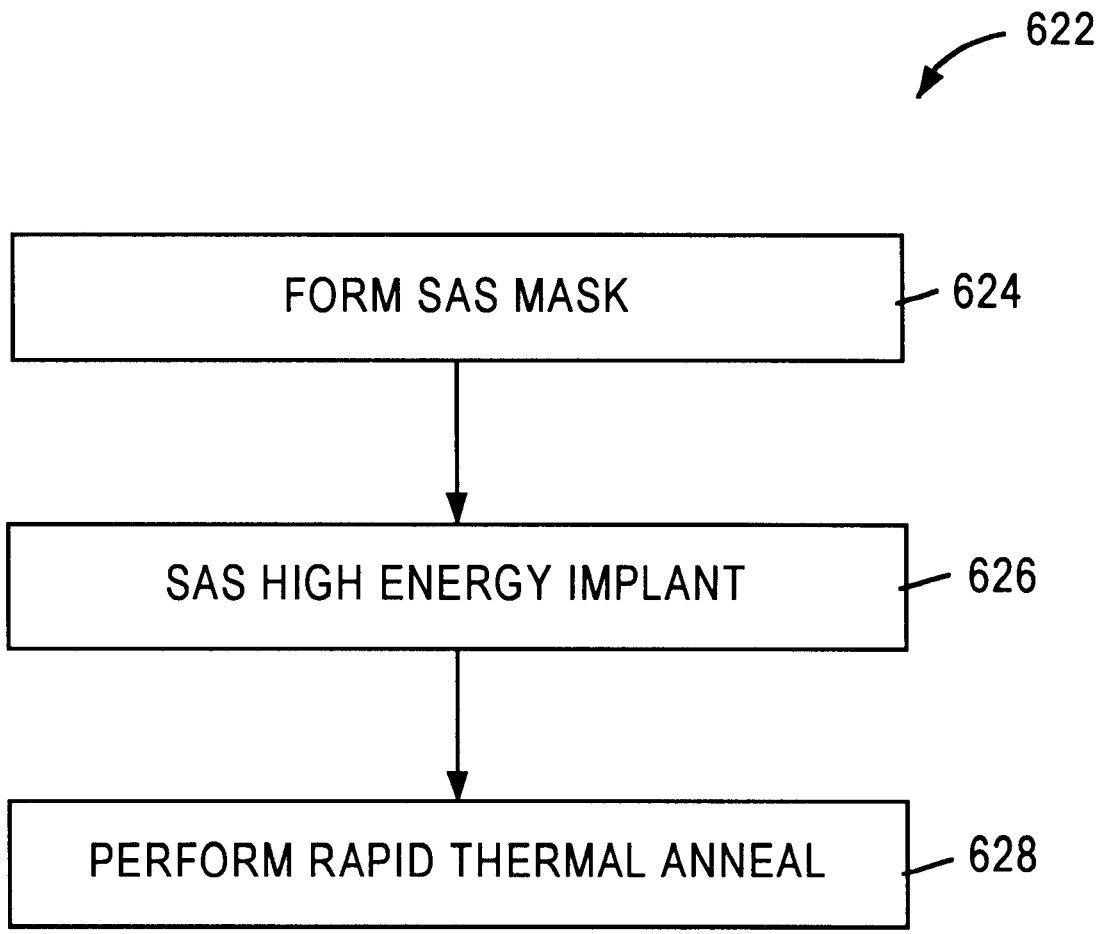
FIG. 6C is a flowchart setting forth a second embodiment of the present invention including a method of forming source interconnect regions using rapid thermal annealing after the high energy implantation step.

The second embodiment of the present invention is a method for forming floating gate memory cells in a semiconductor substrate 102 as depicted in FIGS. 6A and 6C. The method includes a step 600 of forming areas of field oxide 220 to separate regions of substrate 102 corresponding to the cells 200, and then forming in step 602 stacked gate structures 210 extending over the field oxide 220 areas. Then the doped source regions 202 and drain regions 204 are selectively formed in the substrate regions corresponding to cells in alignment with the stacked gate structures 210 in step 604. Step 604 in the second embodiment may be carried out in a similar manner to that set forth for the first embodiment except that the step 608 of performing a self-aligned source etch and step 610 of performing a rapid thermal annealing are eliminated from the process. Once the source and drain regions are formed the substrate 102 is subjected to rapid thermal annealing, using the temperature and time ranges disclosed for the first embodiment, to prevent transient enhanced diffusion of dopant within the substrate 102 (as set forth for the first embodiment in step 620). The interconnection regions are then formed effecting electrical connection between the source regions 202 in step 622 and the fabrication is completed in step 630 using conventional methods.

As depicted in FIG. 6C, in the second embodiment the step 622 of forming interconnection regions effecting electrical connection between the source regions includes high energy implantation of dopants through a portion of the field oxide between source regions. The high energy implantation of dopants through the portion of field oxide between source regions is achieved using a self-aligned source mask in step 624 patterned to expose source regions and the portion of the field oxide between the source regions to a high energy implant step 626. After the interconnection regions are formed the substrate 102 is subjected to rapid thermal annealing in step 628, using the temperature and time ranges disclosed for the first embodiment, to prevent transient enhanced diffusion of dopant within the substrate 102. As in the first embodiment, the rapid thermal annealing step repairs the crystals in the substrate following the formation of the interconnection regions, thereby slowing the rate and amount of transient enhanced diffusion of the various dopants within the substrate 102.

The present invention advantageously provides a method for forming viable floating gate memory cells in a semiconductor substrate. At various points within the memory cell manufacturing process rapid thermal annealing is used to repair any damage that may be caused to the crystals in the substrate by various processing steps. By quickly repairing any damage to the crystals of the substrate, the rate and amount of overall transient enhanced diffusion of the various dopants within the substrate can be greatly reduced, thereby allowing the production of a viable memory cell. The present invention satisfies the need for a method for forming and connecting active regions and components of a high density semiconductor device wherein the erase rates of the device are not sensitive to the etching conditions used to form the connections.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method for forming floating gate memory cells in a semiconductor substrate, comprising the steps of:
   forming areas of field oxide to separate cell regions of a substrate;
   forming stacked gate structures extending over the field oxide areas;
   selectively forming doped source and drain regions in the substrate regions corresponding to cells in alignment with the stacked gate structures comprising, performing a self-aligned source etch, to form a self-aligned source mask, through exposed field oxide regions;
   performing a first rapid thermal anneal of the substrate to prevent transient enhanced diffusion of dopant within the substrate;
   performing a double diffusion implant comprising implanting a first dopant with the self-aligned source mask in place;
   removing the self-aligned source mask;
   performing a second rapid thermal anneal of the substrate to prevent transient enhanced diffusion of dopant within the substrate; and
   after the second rapid thermal anneal, performing a shallow second implant with a second dopant.

2. The method of claim 1, wherein the steps of performing rapid thermal anneals of the substrate comprises exposing the substrate to a temperature in the range of 750° C. to 1200° C.

3. The method of claim 1, wherein the steps of performing rapid thermal anneals of the substrate comprises exposing the substrate to a temperature in the range of 900° C. to 1100° C.

4. The method of claim 1, wherein the steps of performing rapid thermal anneals of the substrate comprises exposing the substrate to a temperature of about 950° C.

5. The method of claim 1, wherein the steps of performing rapid thermal anneals of the substrate comprises exposing the substrate to a temperature above about 750° C. for a period of time in the range of ten seconds to two minutes.

6. The method of claim 1, wherein the steps of performing rapid thermal anneals of the substrate comprises exposing the substrate to a temperature above about 750° C. for about thirty seconds.

7. The method of claim 1, further comprising performing a third rapid thermal anneal of the substrate to prevent transient enhanced diffusion of dopant within the substrate after the step of performing a shallow second implant with a second dopant.

8. The method of claim 7, further comprising forming interconnection regions effecting electrical connection between the source regions, followed by a fourth rapid thermal anneal of the substrate to prevent transient enhanced diffusion of dopant within the substrate.

9. A method for forming active regions of a high density semiconductor device having a substrate and a characteristic erase rate, comprising the steps of:
   forming active regions in the substrate;
   selectively doping source and drain regions with a dopant in the substrate corresponding to the active regions comprising, performing a self-aligned source etch through an exposed region, performing a first rapid thermal anneal of the substrate to prevent transient enhanced diffusion of dopant within the substrate, and performing a double diffusion implant including the steps of implanting a first dopant with a self-aligned source mask in place, removing the self-aligned source mask, performing a second rapid thermal anneal of the substrate to prevent transient enhanced diffusion of dopant within the substrate, and after the second rapid thermal anneal, performing a shallow second implant with a second dopant;
   forming interconnection regions effecting electrical connection between the source regions,
   wherein the transient enhanced diffusion is limited such that the erase rate of the semiconductor device is insensitive to the step of forming interconnection regions.

10. The method of claim 9, wherein the steps of performing rapid thermal anneals of the substrate comprise exposing the substrate to a temperature in the range of 750° C. to 1200° C.

11. The method of claim 9, wherein the steps of performing rapid thermal anneals of the substrate comprise exposing the substrate to a temperature above about 750° C. for a period of time in the range of ten seconds to two minutes.

12. The method of claim 9, further comprising performing a third rapid thermal anneal of the substrate to prevent transient enhanced diffusion of dopant within the substrate after the step of performing a shallow second implant with a second dopant.

13. The method of claim 12, wherein the step of forming interconnection regions effecting electrical connection between the source regions is followed by a fourth rapid thermal anneal of the substrate to prevent transient enhanced diffusion of the dopant within the substrate.

14. A method for forming floating gate memory cells in a semiconductor substrate, comprising the steps of:
   forming areas of field oxide to separate cell regions of a substrate;
   forming stacked gate structures extending over the field oxide areas;
   selectively forming doped source and drain regions in the substrate regions corresponding to cells in alignment with the stacked gate structures comprising, performing a double diffusion implant comprising implanting a first dopant;
   performing a first rapid thermal anneal of the substrate to prevent transient enhanced diffusion of dopant within the substrate;
   performing a shallow second implant with a second dopant;
   performing a second rapid thermal anneal of the substrate to prevent transient enhanced diffusion of dopant within the substrate;

forming interconnection regions effecting electrical connection between the source regions; and performing a third rapid thermal anneal of the substrate to prevent transient enhanced diffusion of dopant within the substrate.

15. The method of claim 14, wherein the step of forming interconnection regions effecting electrical connection between the source regions comprises high energy implantation of dopants through a portion of the field oxide between source regions.

16. The method of claim 15, wherein the high energy implantation of dopants through the portion of field oxide between source regions includes patterning a self-aligned source mask to expose source regions and the position of the field oxide between the source regions.

17. A method for forming active regions of a high density semiconductor device having a substrate and a characteristic erase rate, comprising the steps of:

forming active regions in the substrate;

selectively doping source and drain regions with a dopant in the substrate corresponding to the active regions comprising, performing a double diffusion implant comprising implanting a first dopant, performing a first rapid thermal anneal of the substrate to prevent transient enhanced diffusion of dopant within the substrate, performing a shallow second implant with a second dopant, performing a second rapid thermal anneal of the substrate to prevent transient enhanced diffusion of dopant within the substrate; and forming interconnection regions effecting electrical connection between the source regions, wherein the transient enhanced diffusion is limited such that the erase rate of the semiconductor device is insensitive to the step of forming interconnection regions.

18. The method of claim 17, wherein the step of forming interconnection regions effecting electrical connection between the source regions is followed by a third rapid thermal anneal of the substrate to prevent transient enhanced diffusion of the dopant within the substrate.

19. The method of claim 17, wherein the step of forming interconnection regions effecting electrical connection between the source regions comprises high energy implanting of the dopant between source regions.

20. The method of claim 19, wherein the high energy implanting of the dopant between source regions includes masking with a self-aligned source mask patterned to expose source regions and a portion between the source regions.

* * * * *